United States Patent
Park

(10) Patent No.: US 7,678,686 B2
(45) Date of Patent: Mar. 16, 2010

(54) SEMICONDUCTOR DEVICE HAVING COPPER METAL LINE AND METHOD OF FORMING THE SAME

(75) Inventor: Hyuk Park, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 18 days.

(21) Appl. No.: 11/775,060

(22) Filed: Jul. 9, 2007

(65) Prior Publication Data

US 2008/0017988 A1    Jan. 24, 2008

(30) Foreign Application Priority Data

Jul. 18, 2006   (KR)   .................. 10-2006-0066668

(51) Int. Cl.
*H01L 21/47631*   (2006.01)
(52) U.S. Cl. .................... 438/625; 257/754
(58) Field of Classification Search ......... 257/625–630; 438/625–628, 674–675
See application file for complete search history.

(56) References Cited

U.S. PATENT DOCUMENTS

| | | | | |
|---|---|---|---|---|
| 6,156,655 A * | 12/2000 | Huang et al. | ................ | 438/687 |
| 6,867,135 B1 * | 3/2005 | Bao et al. | ................ | 438/687 |
| 6,881,670 B2 * | 4/2005 | Chen et al. | ................ | 438/655 |
| 2006/0121733 A1 * | 6/2006 | Kilpela et al. | ................ | 438/681 |

FOREIGN PATENT DOCUMENTS

| KR | 1020000061632 | | 10/2000 |
|---|---|---|---|
| KR | 101999001083 | * | 6/2004 |
| KR | 1020040056025 | | 6/2004 |

* cited by examiner

*Primary Examiner*—Steven Loke
*Assistant Examiner*—Kimberly M Thomas
(74) *Attorney, Agent, or Firm*—Lowe Hauptman Ham & Berner, LLP

(57) ABSTRACT

A method of forming a copper metal line in a semiconductor device includes depositing an interlayer insulating layer on a semiconductor substrate having a lower metal line, forming a via contact hole and a metal line pattern in the semiconductor substrate, sequentially depositing a barrier metal film and a copper seed layer, forming a copper film on a surface of the semiconductor substrate, removing the copper film and the barrier metal film, other than the portion of a copper metal line to be formed, removing a native oxide film existing on a surface of the copper metal line of the semiconductor substrate, depositing a silicon layer on the semiconductor substrate, making the deposited silicon layer and copper metal react to each other to form a copper silicide layer, removing a remaining silicon layer without being reacted, and depositing an insulating anti-diffusion film over the semiconductor substrate.

4 Claims, 4 Drawing Sheets

SEMICONDUCTOR DEVICE HAVING COPPER METAL LINE AND METHOD OF FORMING THE SAME

FIELD OF THE INVENTION

The present invention relates to semiconductor devices and, more particularly, to a semiconductor having copper metal line and a method of forming the semiconductor capable of preventing the degradation of an electromigration (EM) characteristic caused by poor adhesion and an unstable surface state between the copper metal line and an insulating anti-diffusion film used when forming the copper metal line by a dual damascene method.

BACKGROUND OF THE INVENTION

Presently, in order to fabricate semiconductor devices with a fast operating speed and high reliability, a metal of copper is used as a metal line material because it has a low resistivity and high resistance against electrical movement or stress compared with a conventional metal of aluminum (Al).

However, a copper metal line is difficult to be etched by an existing dry etch method. Thus, the copper metal line is generally patterned by a single damascene method or a dual damascene method.

The damascene method refers to a method of forming a pattern of a metal line or a contact hole in an interlayer insulating layer for insulating between metal lines, depositing a metal layer and then removing the metal layer by a conventional method, such as Chemical Mechanical Polishing (CMP), thereby forming the metal lines.

The dual damascene method refers to a method of patterning both a metal line and a contact hole in an interlayer insulating layer, filling the patterned portion with a metal layer for the metal line, and removing an unnecessary portion of the metal layer. Due to the advantages of a simplified process and cost effectiveness, the dual damascene method is being widely used as a method of formatting the metal line.

Further, copper has a low adhesive force as compared to a silicon oxide ($SiO_2$). Also, copper has a diffusion coefficient greater, e.g., about 100 times than that of aluminum (Al) within silicon (Si). Thus, in order to secure the reliability of a semiconductor device, there is a need for an anti-diffusion film capable of preventing diffusion while having good adhesiveness with an insulating film.

As far as the anti-diffusion film is concerned, titanium nitride (TiN) is generally used as barrier metal at the sidewalls and bottom of the copper metal line. A silicon nitride (SiN) film is generally used as the insulating anti-diffusion film at the top surface of the copper metal line.

FIGS. 1a to 1d are a cross-sectional perspective view of a semiconductor substrate illustrating a method of forming a copper metal line according to a conventional dual damascene method.

As shown in FIG. 1a, an interlayer insulating layer 30 is deposited on a semiconductor substrate 10 in which a lower metal line 20 is formed. Photo/etch processes are performed to form a via contact hole 40 and a metal line pattern (or a trench) 50 over the semiconductor substrate.

Thereafter, a barrier metal film 60 and a copper seed layer (not shown) are deposited. The semiconductor substrate is processed by an electrochemical plating (ECP) method to form a copper layer 70 as shown in FIG. 1b. The semiconductor substrate over which the copper layer 70 is formed is processed by chemical mechanical polishing (CMP), so that the copper layer 70 and the barrier metal film 60 except for a portion of the metal line to be formed are sequentially removed to thereby form a copper metal line, as shown in FIG. 1c.

Thereafter, while an insulating anti-diffusion film 80 is deposited, the processes as described above are repeated to form an upper copper metal line.

In the copper metal line formation process according to the conventional dual damascene method, a silicon nitride (SiN) film is generally used as the insulating anti-diffusion film of a copper metal. The SiN film is deposited on the copper metal line after a chemical mechanical polishing (CMP) process for the copper metal is performed as shown in FIG. 1d. However, since the copper metal and the SiN film have poor adhesion and form an unstable surface state, there are problems in that an electromigration (EM) characteristic is degraded and reliability is lowered.

In other words, as shown in FIGS. 2a and 2b, an unstable adhesive surface or an unstable surface state of the SiN film and the copper metal line causes to be provided as the migration path of copper atoms by electron wind, which results in forming a void such as a via void or a line void. In particular, in a downstream electron flow as shown in FIG. 2b, the unstable adhesive surface or the unstable surface state of the SiN film and the copper metal line leads to a line void. Accordingly, there is a problem in that the reliability of a semiconductor device is degraded.

SUMMARY OF THE INVENTION

It is, therefore, an object of the present invention to provide a method of forming a copper metal line in a semiconductor device, which is capable of improving a reliability by preventing the degradation of the electromigration (EM) characteristic, which is caused by poor adhesion and an unstable surface state between an insulating anti-diffusion film and a copper metal line.

In accordance with an aspect of the present invention, there is provided a method of forming a copper metal line in a semiconductor device, including:

an intra-metal dielectric (IMD) deposition step of depositing an interlayer insulating layer on a semiconductor substrate in which a lower metal line is formed;

a photo process and an etch process step of forming a via contact hole and a metal line pattern in the semiconductor substrate;

a seed deposition step of sequentially depositing a barrier metal film and a copper seed layer;

an electrochemical plating (ECP) step of forming a copper layer on a surface of the semiconductor substrate by an electro mechanical plating (ECP) method;

a chemical mechanical polishing (CMP) step of removing the copper layer and the barrier metal film, other than the portion of a copper metal line to be formed, from the semiconductor substrate having the copper layer formed thereon;

a pre-deposition processing step of removing a native oxide film existing on a surface of the copper metal line of the semiconductor substrate;

a silicon deposition step of depositing a silicon (Si) layer on the surface of the semiconductor substrate by an atomic layer deposition method;

an annealing step of making the deposited silicon layer and copper metal react to each other to form a copper silicide layer;

a wet etch step of removing a remaining silicon layer without being reacted in the annealing step; and an insulating anti-diffusion film deposition step of depositing an insulating anti-diffusion film over the semiconductor substrate.

In accordance with another aspect of the present invention, there is provided a semiconductor having a metal line of copper metal formed therein, including:

a semiconductor substrate having a lower metal line therein;

an interlayer insulating layer deposited on the semiconductor substrate;

a copper metal line formed in the interlayer insulating layer;

a barrier metal film formed on the sides and bottom of the copper metal line; and a copper silicide film formed on the top of the copper metal line.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE EMBODIMENTS

Hereinafter, embodiments of the present invention will be described in detail with reference to the accompanying drawings so that they can be readily implemented by those skilled in the art.

Figure 1A:
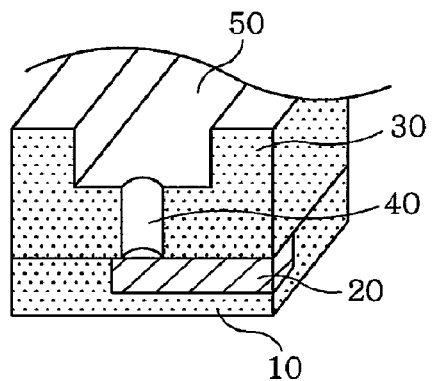
FIGS. 1a to 1d are a cross-sectional perspective views illustrating a method of forming a copper metal line according to a conventional dual damascene method.
Figure 1B:
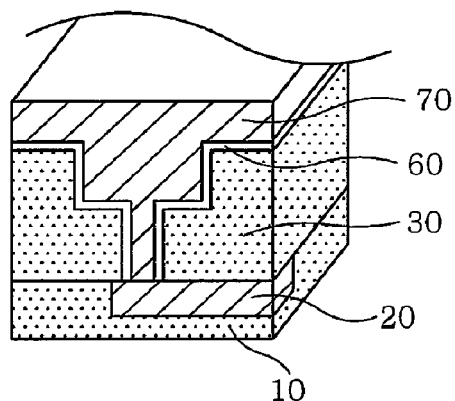
Figure 1C:
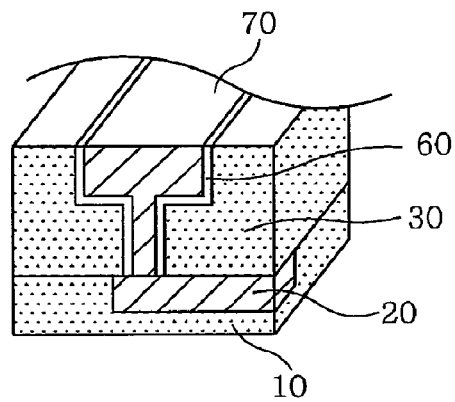
Figure 1D:
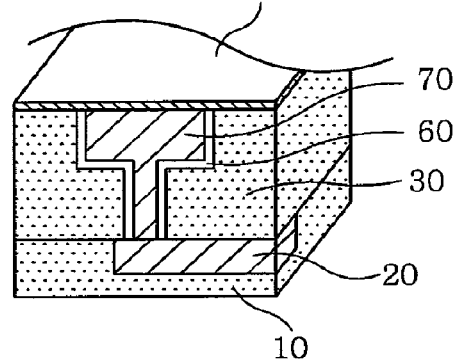
Figure 2A:
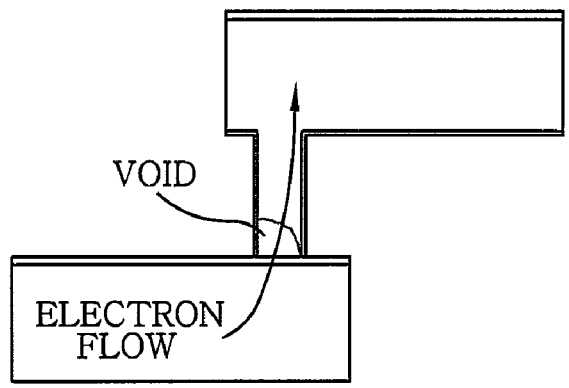
FIGS. 2a and 2b are a diagram illustrating voids caused by an electromigration (EM) in the copper metal line, at an upstream electron flow and a down stream electron flow, respectively, in accordance with the conventional dual damascene method.
Figure 2B:
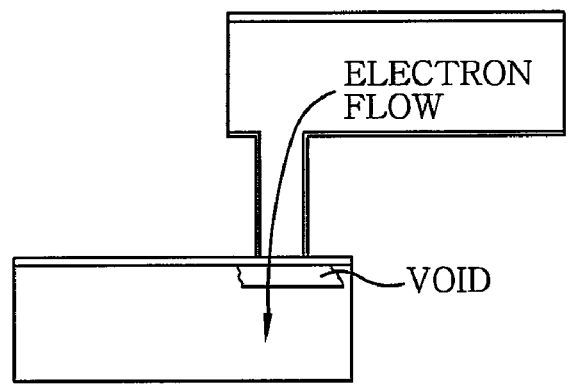
Figure 3:
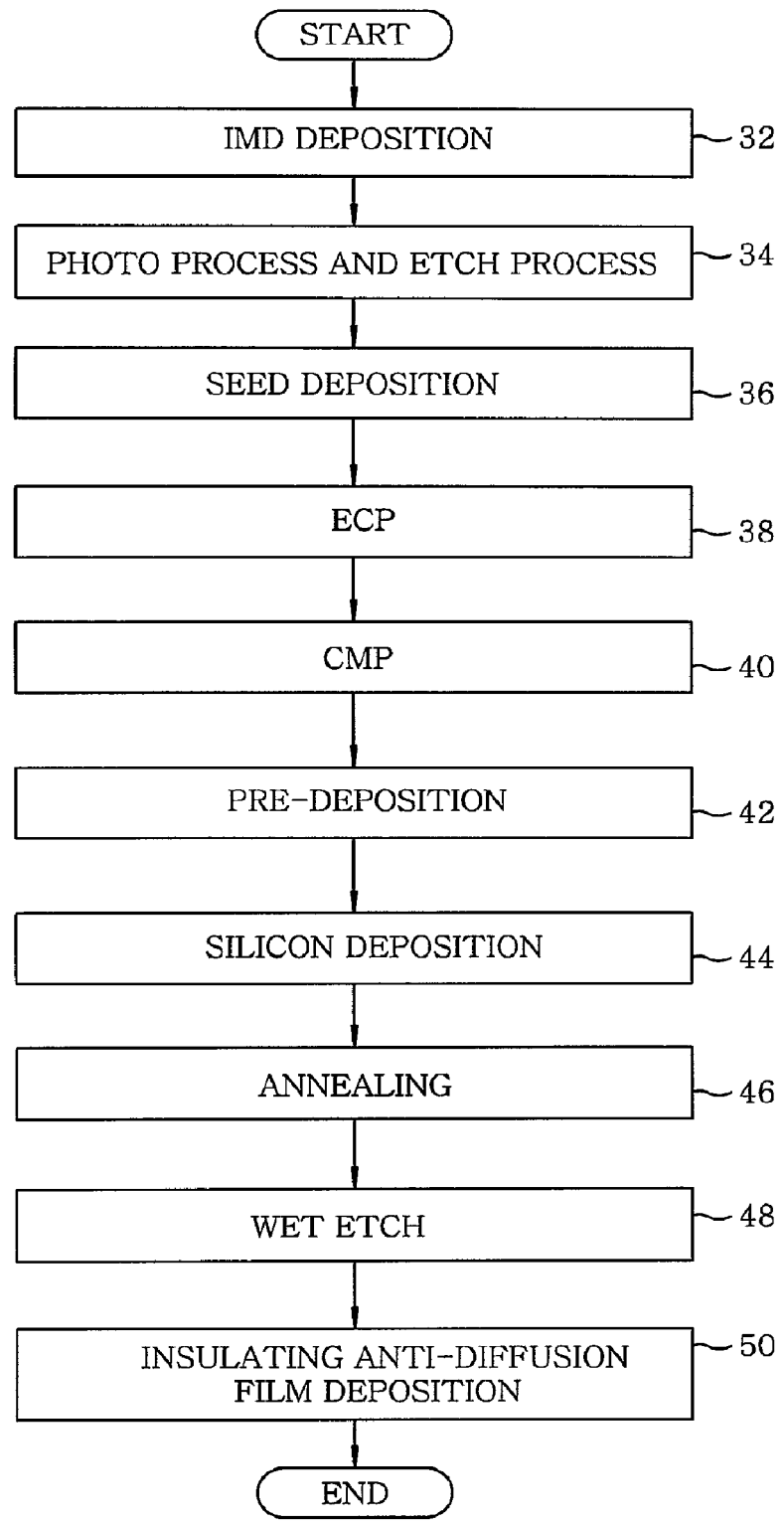
FIG. 3 is a process flowchart illustrating a method of forming a copper metal line in a semiconductor device according to the present invention.

Referring to FIG. 3, there is shown a process flowchart illustrating a method of forming a copper metal line in a semiconductor device according to the present invention.

As shown in FIG. 3, a method of forming a copper metal line of a semiconductor device includes the steps of an IMD (interlayer insulating layer) deposition 32, a photo process and an etch process 34, a seed deposition 36, an electro chemical plating (ECP) 38, a chemical mechanical polishing (CMP) 40, a pre-deposition processing 42, a silicon deposition 44, an annealing 46, a wet etch 48, and an insulating anti-diffusion film deposition 50.

The IMD deposition 32 is a step of depositing an interlayer insulating layer on a semiconductor substrate in which a lower metal line is formed. In more detail, a first insulating film is deposited as an insulating film between metal line layers, and an etch-stop film is deposited on the first insulating film. The etch-stop film is a layer with a high etch selectivity in a trench etch process to be described later on. A second insulating film is then deposited as an inter-line insulating film on the etch-stop film. At this time, the semiconductor may be formed with not only a stack structure of the first insulating film/the etch-stop film/the second insulating film, but also a single layer or a multiple layer without having the etch-stop film.

The photo process and the etch process 34 are the steps of forming a via contact hole and a metal line pattern in the semiconductor substrate. More specifically, the photo process and the etch process 34 includes a via patterning process of performing a via photo process to form a via mask pattern on the second insulating film and performing a via etch process to form the via contact hole. Further, the photo process and the etch process 34 includes a trench patterning process of performing a trench photo process to form a trench mask pattern on the second insulating film and performing a trench etch process to form a trench.

In general, the formation of the via contact hole and the metal line pattern by a dual damascene method is achieved by a method of performing the via patterning process anterior to the trench patterning process (referred to as a via-first method), or a method of performing the trench patterning process anterior to the via patterning process (referred to as a trench-first method).

The seed deposition 36 is a step of sequentially depositing a barrier metal film and a copper seed layer. The barrier metal film serves to prevent the diffusion of copper and is generally comprised of Ti or titanium, or a stack structure thereof. The copper seed layer serves as a seed layer in the subsequent electro chemical plating (ECP).

The electro chemical plating (ECP) 38 is a step of forming a copper layer on the surface of the semiconductor substrate by an electro chemical plating (ECP) method.

The chemical mechanical processing (CMP) 40 is a step of removing the copper layer and the barrier metal film, other than the portion to be formed as a metal line portion, from the semiconductor substrate in which the copper layer is formed by means of a chemical mechanical polishing (CMP) process. More specifically, the barrier metal film and the copper layer existing on the second insulating film, other than copper existing within the trench pattern, are removed by the chemical mechanical processing (CMP) process, thus forming the metal line pattern.

The pre-deposition processing 42 is a step of removing a native oxide film existing on the copper metal line of the semiconductor substrate. That is, in this step, in order to form uniform silicide in the subsequent silicon deposition 44 and the annealing 46, the native oxide film formed on the surface of copper layer by using an etchant including diluted sulphuric acid ($H_2SO_4$) and hydrogen peroxide ($H_2O_2$).

The silicon deposition 44 is a step of depositing a Si layer on the semiconductor substrate. In more detail, in this step, the Si layer is deposited on the surface of copper metal in order to form a copper silicide by means of an atomic layer deposition method. Such atomic layer deposition method is performed under the process condition of 200 mTorr in pressure and 100 to 200° C. in temperature.

The annealing 46 is a step of making the deposited Si layer and copper metal to react with each other. In this step, the copper metal reacts to Si in the Si layer to form the copper silicide. The annealing condition is preferably performed in Rapid Thermal Annealing (RTA) equipment under the process condition having a temperature of approximately 450 to 820° C. for 30 seconds.

The wet etch 48 is a step of removing the Si layer that has not reacted in the annealing step 46.

The insulating anti-diffusion film deposition 50 is a step of depositing an insulating anti-diffusion film on the semiconductor substrate. The insulating anti-diffusion film is preferably formed from a Silicon Nitride (SiN) film or a Silicon Carbon Nitride (SiCN) film.

Accordingly, in the method of forming a copper metal line in a semiconductor device in accordance with an embodiment of the present invention, it is possible to improve the adhesion of the copper metal line with the insulating anti-diffusion film since the copper silicide layer is formed on the surface of the copper metal line. Thus, it is also possible to improve the electromigration (EM) characteristic because the formation of incomplete interface with the insulating anti-diffusion film, which may serve as a major diffusion path of electromigration (EM), is prevented.

In the method of forming a copper metal line of a semiconductor device in accordance with an embodiment of the present invention, it is preferable to form the Si layer deposited in the atomic layer deposition method to be 10 to 20 angstrom in thickness. This makes help the thickness of the copper silicide layer formed in the RTA process be 80 angstrom. Accordingly, the resistance of the copper metal line is not lowered significantly while improving the electromigration (EM) characteristic.

In addition, the pre-deposition processing step preferably includes removing the native oxide film existing on the surface of copper metal by using $H_2+N_2$ plasma.

Further, the wet etch step preferably includes removing the Si layer by using an etchant including $H_2SO_4$ and $H_2O_2$.

Figure 4:
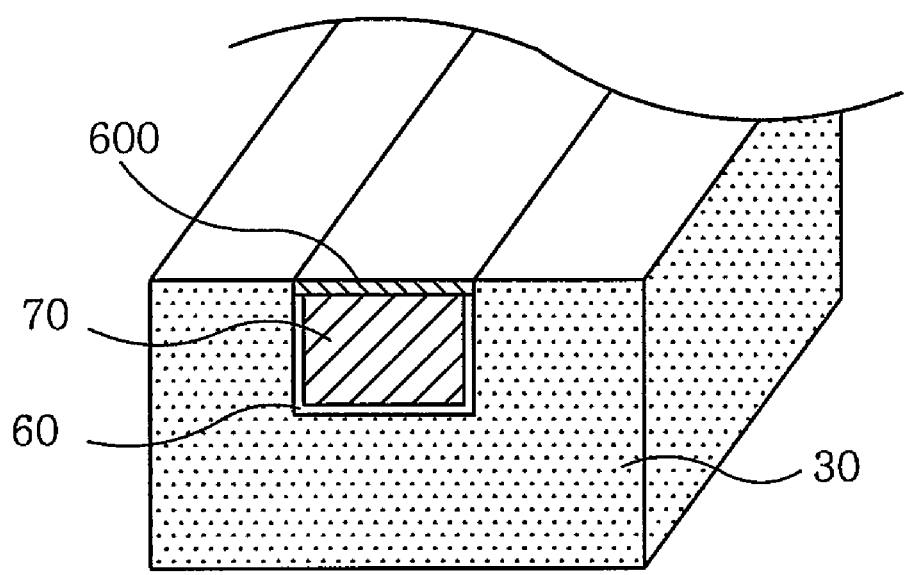
FIG. 4 is a cross-sectional perspective view of the semiconductor device, which is fabricated through the use of the method of forming a copper metal line in a semiconductor device as shown in FIG. 3.

FIG. 4 is a cross-sectional perspective view of the semiconductor device having the copper metal line, which is fabricated through the use of the method of forming a copper metal line in a semiconductor device as shown in FIG. 3.

As shown in FIG. 4, the semiconductor device includes a semiconductor substrate (not shown) having a lower metal line (not shown) therein, an interlayer insulating layer 30 deposited on the semiconductor substrate, a copper metal line 70 formed in the interlayer insulating layer 30 and having an elongated rectangular shape, a barrier metal film 60 formed to surround the copper metal line 70 on the sides and bottom thereof, and a copper silicide layer 600 formed on the top of the copper metal line 70.

The semiconductor device as set forth above is preferably fabricated by the method of forming a copper metal line of a semiconductor device including the IMD deposition step, the photo process and the etch process step, the seed deposition step, the ECP step, the CMP step, the pre-deposition processing step, the silicon deposition step, the annealing step, the wet etch step, and the insulating anti-diffusion film deposition step. Accordingly, it is possible to form the copper metal line of the semiconductor device by the conventional single damascene method or the conventional dual damascene method.

The copper metal line in the semiconductor device according to the present invention includes the copper silicide layer formed on the copper metal line unlike the existing copper metal line, so that the electromigration (EM) characteristic can be improved. Further, since the SiN film is not used in the interlayer insulating layer as the conventional insulating anti-diffusion film, there is an advantage in that an overall effective dielectric constant of the insulating film can be lowered.

While the invention has been shown and described with respect to the preferred embodiments, it will be understood by those skilled in the art that various changes and modifications may be made without departing from the scope of the invention as defined in the following claims.

What is claimed is:

1. A method of forming a copper (Cu) metal line in a semiconductor device, said method comprising the steps of:
   an intra-metal dielectric (IMD) deposition step of depositing an interlayer insulating layer on a semiconductor substrate in which a lower metal line is formed;
   a photo process and an etch process step of forming a via contact hole and a metal line pattern in the semiconductor substrate;
   a seed deposition step of sequentially depositing a metal barrier film and a seed copper (Cu) film;
   an electrochemical plating (ECP) step of forming a copper (Cu) film on a surface of the semiconductor substrate by an electrochemical plating (ECP) method;
   a chemical mechanical polishing (CMP) step of removing the copper (Cu) film and the metal barrier film, other than the portion of a copper metal line to be formed, from the semiconductor substrate having the copper (Cu) film formed thereon, by means of a chemical mechanical polishing (CMP) process;
   a pre-deposition processing step of removing a native oxide film existing on a surface of the copper (Cu) metal line of the semiconductor substrate;
   a silicon deposition step of depositing a silicon (Si) layer on the surface of the copper metal line of the semiconductor substrate by an atomic layer deposition method;
   an annealing step of making the deposited silicon layer and copper (Cu) metal react to each other to form a copper (Cu) silicide layer;
   a wet etch step of removing a remaining silicon layer without being reacted in the annealing step; and
   an insulating anti-diffusion film deposition step of depositing an insulating anti-diffusion film over the semiconductor substrate;
   wherein the silicon layer deposited in the atomic layer deposition method of the silicon deposition step has a thickness ranging from 10 to 20 angstrom.

2. The method of claim 1, wherein the copper (Cu) silicide layer has a thickness ranging from about 80 angstrom.

3. The method of claim 1, wherein the pre-deposition processing step includes removing the native oxide film existing on the surface of a copper (Cu) metal by using $H_2+N_2$ plasma.

4. The method of claim 1, wherein the wet etch step includes removing the silicon layer by using an etchant including sulphuric acid ($H_2SO_4$) and hydrogen peroxide ($H_2O_2$).

* * * * *